(12) United States Patent
Banine et al.

(10) Patent No.: US 7,372,058 B2
(45) Date of Patent: May 13, 2008

(54) EX-SITU REMOVAL OF DEPOSITION ON AN OPTICAL ELEMENT

(75) Inventors: Vadim Yevgenyevich Banine, Helmond (NL); Lambertus Adrianus Wildenberg, Geldrop (NL); Vladimir Mihailovitch Krivtsun, Moscow (RU); Alexander Matthijs Struycken, Eindhoven (NL); Johannes Bernardus Ridder, Veldhoven (NL); Vladimir Vitalevitch Ivanov, Moscow (RU); Josephus Jacobus Smits, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 319 days.

(21) Appl. No.: 11/235,547

(22) Filed: Sep. 27, 2005

(65) Prior Publication Data

US 2007/0069160 A1    Mar. 29, 2007

(51) Int. Cl.
*G03B 7/20*    (2006.01)
(52) U.S. Cl. ...................... 250/504 R; 134/1
(58) Field of Classification Search ............ 250/504 R, 250/492.1; 134/1
See application file for complete search history.

(56) References Cited

U.S. PATENT DOCUMENTS 6,657,206 B2* 12/2003 Keogh et al. ............ 250/492.1
2006/0175558 A1* 8/2006 Bakker et al. ........... 250/492.2

* cited by examiner

*Primary Examiner*—Kiet T. Nguyen
(74) *Attorney, Agent, or Firm*—Pillsbury Winthrop Shaw Pittman, LLP

(57) ABSTRACT

A collector assembly with a radiation collector, a cover plate and a support member connecting the radiation collector to the cover plate are provided. The cover plate is designed to cover an opening in a collector chamber. The collector chamber opening may be large enough to pass the radiation collector and the support member. The removed radiation collector can be cleaned with different cleaning procedures, which may be performed in a cleaning device. Such cleaning device may for example consist of the following: a circumferential hull designed to provide an enclosure volume for circumferentially enclosing at least the radiation collector; an inlet configured to provide at least one of a cleaning gas and a cleaning liquid to the enclosure volume to clean at least said radiation collector; and an outlet configured to remove said at least one of said cleaning gas and said cleaning liquid from the enclosure volume.

10 Claims, 10 Drawing Sheets

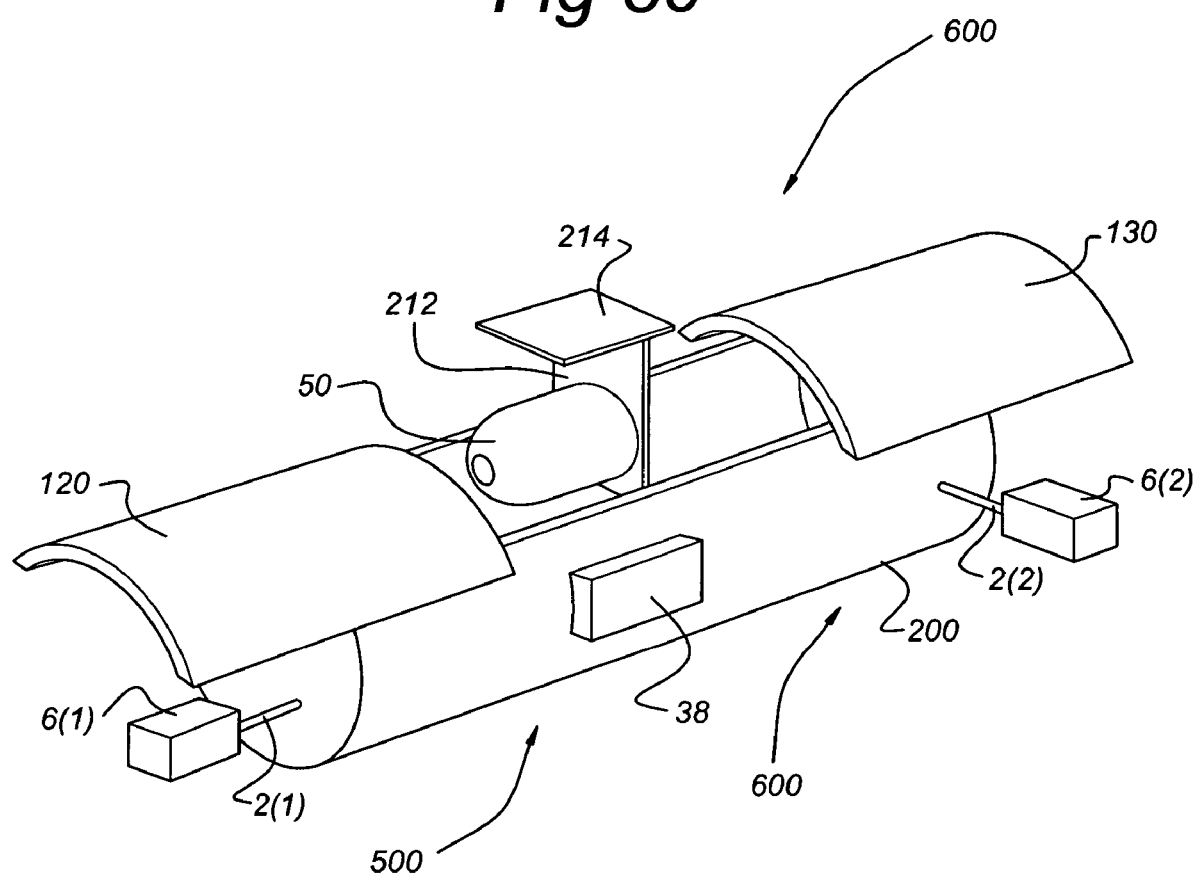

EX-SITU REMOVAL OF DEPOSITION ON AN OPTICAL ELEMENT

BACKGROUND OF THE INVENTION

1. Field of the Invention

The present invention relates to ex-situ removal of deposition on an optical element such as used in a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources will probably use tin or another metal vapor to produce EUV radiation. This tin may leak into the lithographic apparatus, and will be deposited on mirrors in the lithographic apparatus, e.g. the mirrors of the radiation collector. The mirrors of such a radiation collector may have a EUV reflecting top layer of, for example, ruthenium (Ru). Deposition of more than approximately 10 nm tin (Sn) on the reflecting Ru layer will reflect EUV radiation in the same way as bulk Sn. It is envisaged that a layer of a few nm Sn is deposited very quickly near a Sn-based EUV source. The overall transmission of the collector will decrease significantly, since the reflection coefficient of tin is much lower than the reflection coefficient of ruthenium. In order to prevent debris from the source or secondary particles generated by this debris from depositing on the radiation collector, contaminant barriers may be used. Though such contaminant barriers may remove part of the debris, still some debris will deposit on the radiation collector or other optical elements.

SUMMARY OF THE INVENTION

It is an aspect of the present invention to provide a method for ex-situ removal of deposition on an optical element, like a radiation collector of a lithographic apparatus.

To that end, the invention relates to a method of cleaning deposition from a radiation collector comprising: providing a collector chamber and a collector assembly, the collector assembly comprising a radiation collector and a cover plate connected to the radiation collector by a support member, and the cover plate being connected to the collector chamber and covering a collector chamber opening such that the radiation collector is accommodated by said collector chamber; disconnecting said cover plate from said collector chamber; removing said collector assembly such that said radiation collector moves out of said collector chamber via said collector chamber opening; providing a circumferential hull designed to circumferentially enclose at least the radiation collector, thereby providing an enclosure volume; providing at least one of a cleaning gas and a cleaning liquid to the enclosure volume; and removing at least part of the deposition from at least the radiation collector by said at least one of said cleaning gas and said cleaning liquid.

According to another aspect of the invention, the invention relates to a collector assembly comprising a radiation collector, a cover plate and a support member connecting said radiation collector to said cover plate, said cover plate being designed to cover an opening in a collector chamber.

According to yet another aspect, the invention relates to a system comprising a collector chamber and a collector assembly, the collector chamber comprising a collector chamber opening, the collector assembly comprising a radiation collector, a cover plate and a support member connecting said radiation collector to said cover plate, said cover plate being designed to cover said collector chamber opening, said collector chamber opening being large enough to pass said radiation collector and the support member.

According to again another aspect, the invention relates to a lithography apparatus comprising: a radiation source for generating radiation; a collector chamber accommodating a radiation collector; a collector assembly comprising said radiation collector, a cover plate and a support member connecting said radiation collector to said cover plate, said cover plate covering an opening in said collector chamber; a first contaminant barrier arranged between said radiation source and said radiation collector; a second contaminant barrier, the second contaminant barrier being drivingly connected to a motor; a hollow shaft for guiding a cable from said motor to a location outside said collector chamber not through said radiation collector; an illumination system configured to condition a radiation beam derived from said radiation; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate.

According to yet another aspect, the invention relates to an assembly comprising a collector assembly and a cleaning device, the collector assembly comprising a radiation collector, a cover plate and a support member connecting said radiation collector to said cover plate, said cover plate being designed to cover an opening in a collector chamber, said cleaning device comprising: a circumferential hull designed to provide an enclosure volume for circumferentially enclosing at least the radiation collector; an inlet configured to provide at least one of a cleaning gas and a cleaning liquid to the enclosure volume to clean at least said radiation collector; and an outlet configured to remove said at least one of said cleaning gas and said cleaning liquid from the enclosure volume.

According to another aspect of the invention, the invention relates to a cleaning method comprising: providing a lithographic apparatus with at least one optical component contaminated with a deposition; providing a circumferential hull designed to circumferentially enclose said optical component, thereby providing an enclosure volume; providing at least one of a cleaning gas and a cleaning liquid to the enclosure volume; and removing at least part of the deposition from the optical component.

According to yet another aspect of the invention, the invention relates to a cleaning device, comprising: a circumferential hull designed to provide an enclosure volume to circumferentially enclose at least one optical component; an inlet configured to provide at least one of a cleaning gas and a cleaning liquid to the enclosure volume; and an outlet configured to remove at least said one of said cleaning gas and said cleaning liquid from the enclosure volume.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIGS. 8a, 8b and 8c schematically depict different optional cleaning devices;

DETAILED DESCRIPTION

Figure 1:
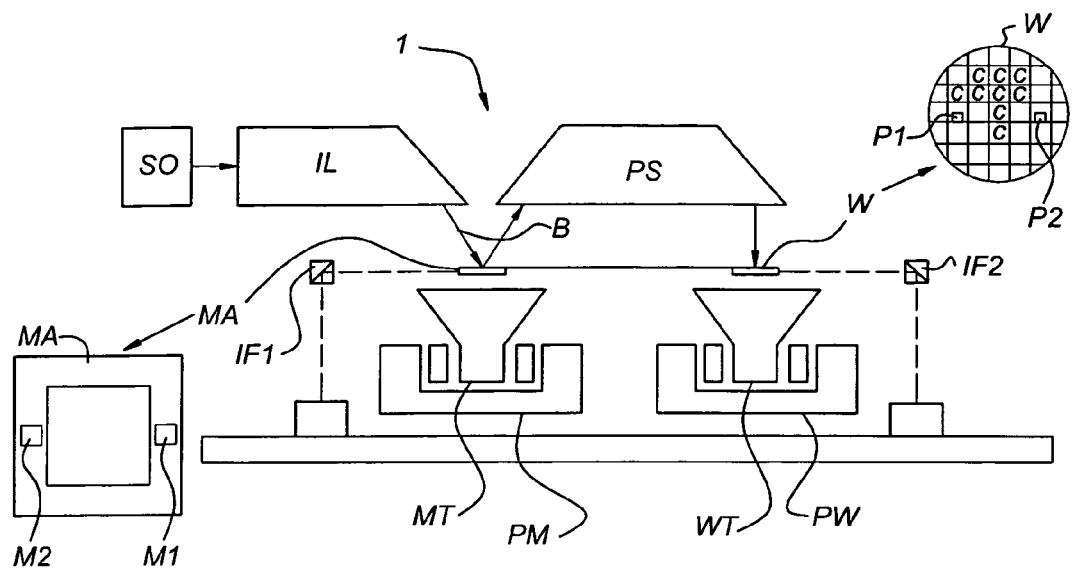
FIG. 1 schematically depicts a lithographic apparatus according to an embodiment of the present invention.

FIG. 1 schematically depicts a lithographic apparatus 1 according to an embodiment of the present invention. The apparatus 1 includes a source SO for generating radiation, an illumination system (illuminator) IL configured to condition a radiation beam B (e.g. UV radiation or EUV radiation) from the radiation received from source SO. The source SO may be provided as a separate unit. A support (e.g. a mask table) MT is configured to support a patterning device (e.g. a mask) MA and is connected to a first positioning device PM configured to accurately position the patterning device MA in accordance with certain parameters. A substrate table (e.g. a wafer table) WT is configured to hold a substrate (e.g. a resist-coated wafer) W and is connected to a second positioning device PW configured to accurately position the substrate W in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives, radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

a. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

b. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

c. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

The term "layer" used herein, as known to the person skilled in the art, may describe layers having one or more boundary surfaces with other layers and/or with other media like vacuum (in use). The term "layer" may also indicate a number of layers. These layers may be next to each, other or on top of each other, etc. They may also include one material or a combination of materials. It should also be noted that the term "layers" used herein may, describe continuous or discontinuous layers. For example, a coating may be a layer on top of part of an optical element.

In the present invention, the term "material" may also be interpreted as a combination of materials. The term "deposition" herein refers to material that is chemically or physically attached to a surface (e.g. the surface of an optical element), as known to the person skilled in the art. Such deposition may be a layer, but it may also include a multi-layer structure. The deposition may include a cap layer, like a protective coating, but it may also include undesired deposits like sputtered elemental particles from a source. The deposition may also include redeposition products or evaporation products that have deposited. The deposition may also include a cap layer as protection layer including such sputtered particles, e.g. after use of an apparatus with a source that sputters particles, or including a deposition from material including one or more elements selected from the group of B, C, Si, Ge and Sn. The term "element" in the phrase "wherein the deposition includes one or more elements selected from the group of B, C, Si, Ge and Sn and combinations thereof", refers to a deposition or cap layer including one or more of these elements, or including particles including one or more of such elements, or including compounds (like e.g. Si or Sn oxides, Si or Sn carbides, Si or Sn nitrides, etc.) including one or more of these elements, or including alloys including one or more of these elements, or combinations thereof (like e.g. deposition including Sn, O, C and H), as will be clear to the person skilled in the art. The phrase "deposition including one or more elements selected from the group of B, C, Si, Ge and Sn and combinations thereof", may in a specific embodiment refer to a mono-layer or multi-layers including atomic B, C, Si, Ge and Sn, or combinations thereof. Elemental layers or nitride layers, etc., may include oxygen impurities, as known to the person skilled in the art.

The term "halogen containing gas" or "hydrogen containing gas" refers to gasses or gas mixtures including at least a halogen gas or hydrogen gas, respectively. The term "halogen" in the term "halogen containing gas" refers to at least one or more selected of F, Cl, Br and I, either as an atom (radical) or as compound, for example $F_2$, $Cl_2$, $Br_2$, $I_2$, HF, HCl, HBr, HI, interhalogen compounds, for example $ClF_3$, or other compounds including one or more selected of F, Cl, Br and I which can be brought into the gas phase at a temperature between about 50-500° and which may a) either react or reduce compounds (deposition) including one or more of B, C, Si, Ge and Sn, respectively, to elemental B, C, Si, Ge and Sn, respectively, or b) react with compounds including one or more of B, C, Si, Ge and Sn, respectively, under the formation of volatile products, or c) react with compounds including one or more of B, C, Si, Ge and Sn, respectively, under the formation of products that may form volatile products upon reaction with a halogen or a hydrogen, or d) react with elemental B, C, Si, Ge and Sn, respectively, to form volatile products, or e) provide halogen radicals when brought into contact with, for example, a hot wire or a plasma (such that these radicals can react with deposition). $F_2$, $Cl_2$, $Br_2$, $I_2$ may be used, in particular $I_2$. Such gasses may further include additional components like buffer gasses, such as Ar, etc. The term "halogenide" refers to, for example, binary and higher compounds of a halogen like I, Br, Cl, etc. with, for example, C, Si or Ge, for example $CCl_4$, $SiCl_4$, etc.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm, e.g. 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. The person skilled in the art understands that radiation having a wavelength in the range of, for example, 5-20 nm relates to radiation with a certain wavelength band, of which at least part is in the range of 5-20 nm.

Figure 2:
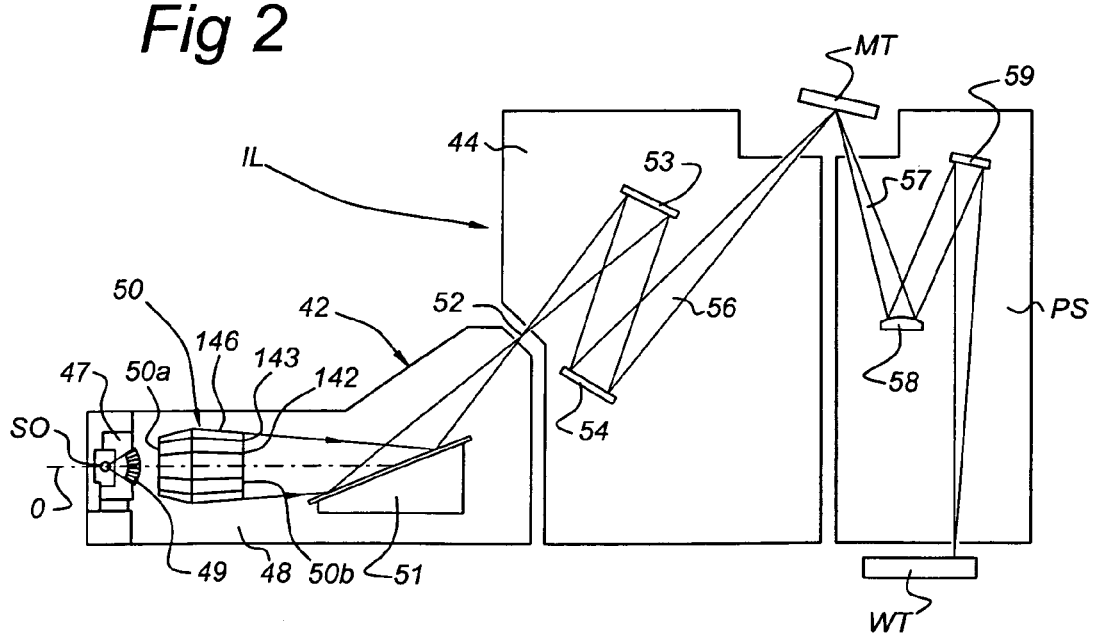
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 which is positioned in or behind an opening in source chamber 47. The gas barrier 49 may include a channel structure.

The collector chamber 48 includes a radiation collector 50 which may be formed by a grazing incidence collector. radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present than 58, 59. Radiation collectors 50 are known from the prior art.

All optical elements shown in FIG. 2 (and optical elements not shown in the schematic drawing of this embodiment) are vulnerable to deposition of contaminants produced by source SO, for example, Sn. This is the case for the radiation collector 50 and, if present, the grating spectral filter 51. Hence, the cleaning method of the present invention may be applied to those optical elements, but also to normal incidence reflectors 53, 54 and reflective elements 58, 59 or other optical elements, for example additional mirrors, gratings, etc.

Radiation collector 50 may be a grazing incidence collector. The collector 50 is aligned along an optical axis O. The source SO or an image thereof is located on optical axis O. The radiation collector 50 may include reflectors 142, 143, 146. These reflectors 142, 143, 146 may be nested and rotationally symmetric about optical axis O. In FIG. 2 (as well as in other Figures), an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Usually, this volume within outer reflector(s) 146 is circumferentially closed, although small openings may be present. All the reflectors 142, 143 and 146 include surfaces of which at least part includes a reflective layer or a number of reflective layers. On the surface of these reflective layers, there may in addition be a cap layer for protection or as optical filter provided on at least part of the surface of the reflective layers.

The radiation collector 50 is usually placed in the vicinity of the source SO or an image of the source SO. Each reflector 142, 143, 146 may include at least two adjacent reflecting surfaces (see also FIGS. 3, 4 and 6), the reflecting surfaces further from the source SO being placed at smaller angles to the optical axis O than the reflecting surface that is closer to the source SO. In this way, a grazing incidence collector 50 is constructed for generating a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

During use, on one or more of the outer 146 and inner 142/143 reflector(s) deposition may be found. The deposition may include one or more elements selected from the group of B, C, Si, Ge and Sn, and combinations thereof. C (carbon) may be a deposition on the radiation collector 50 due to the undesired presence of hydrocarbons in the lithographic apparatus, but may also be deliberately present as protective cap layer. Si (silicon) may also be deliberately present as protective cap layer, whereas Sn (tin) may e.g. be present due to source SO that produces Sn, but may be deliberately present as protective cap layer. Further, Si may be present as deposition due to outgassing of the resist. The deposition may also include, for example, Mo, W, Fe, Al, Ni, Au, etc. materials that are used in, for example, the walls of the apparatus, the electrodes, gas barriers, etc.

The radiation collector 50 is deteriorated by such deposition (deterioration by debris, e.g. ions, electrons, clusters, droplets, electrode corrosion from the source SO). Deposition of Sn, for example due to a Sn source, may, after a few mono-layers, be detrimental to reflection of the radiation collector 50 or other optical elements, which may necessitate the cleaning of such optical elements.

Deposition, especially deposition including one or more elements selected from the group of B, C, Si, Ge and Sn, may be removed in an embodiment by halogens (as gasses), for example, $F_2$, $Cl_2$, $Br_2$ and $I_2$ and, in another embodiment by hydrogen radicals, and in yet a further embodiment by combinations of hydrogen radicals and one or more halogens, either applied simultaneously or subsequently. In case there is a deposition with e.g. Sn, or Si or Ge, due to the presence of small amounts of oxygen, there will usually also be to some extent Sn oxide and Si or Ge oxide, respectively. To remove these oxides, a reduction step may be necessary before elemental Sn, Si, Ge can be removed by the formation of halogenides and/or hydrides.

Removal of Radiation Collector

Figure 3:
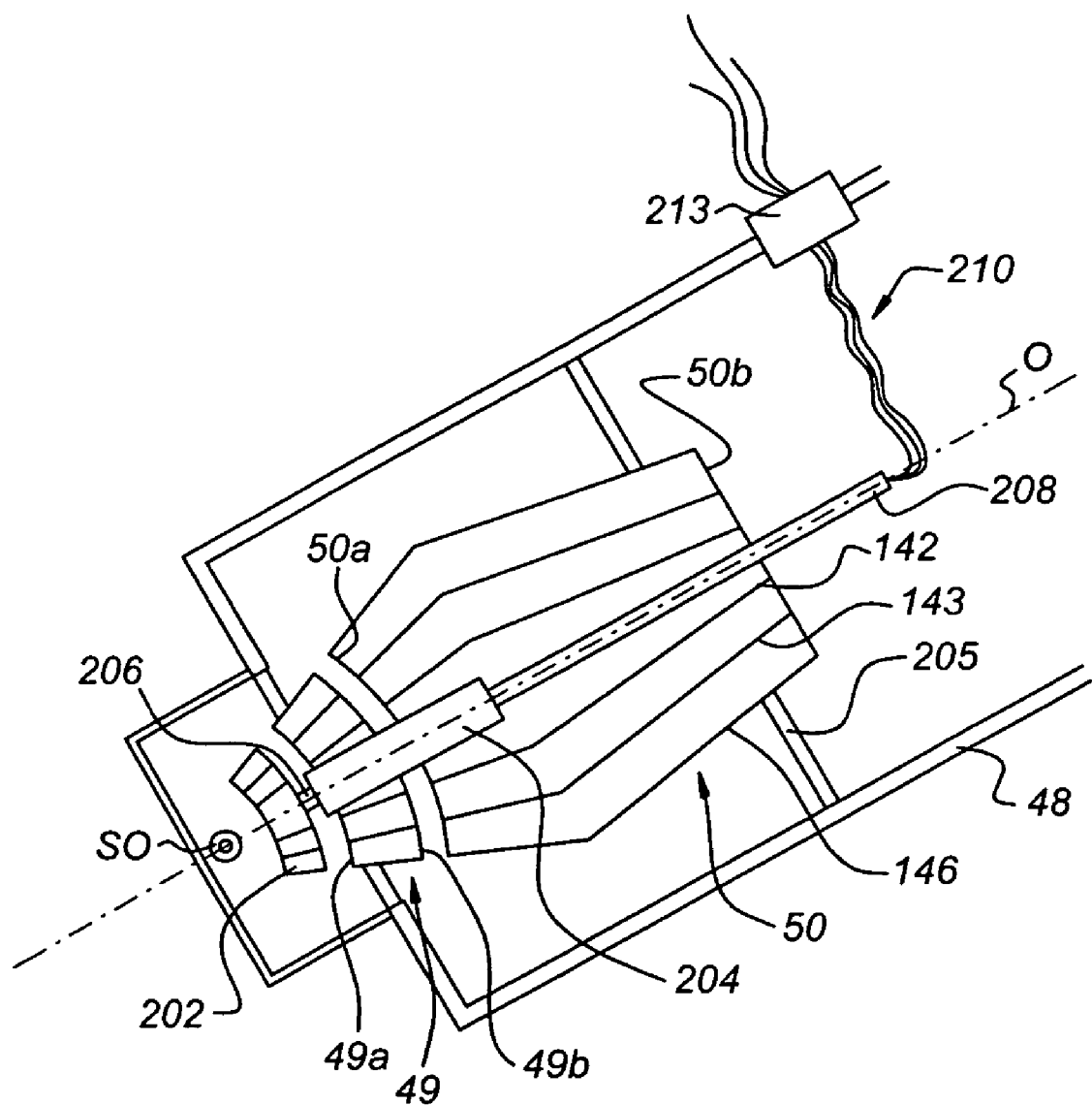
FIG. 3 schematically depicts a cross section through a source collector module.

FIG. 3 shows an embodiment of a source collector module where the optical axis O intersects a horizontal plane (e.g. earth) under a predetermined angle as may the case in many practical situations. The contaminant barrier 49 is shown to have an upstream contaminant barrier side 49*a* and a downstream contaminant barrier side 49*b*.

The source collector module comprises an additional, rotatable contaminant barrier 202. The rotatable contaminant barrier 202 is located upstream (i.e., closer to the source SO) than the contaminant barrier 49. The rotatable contaminant barrier 202 is rotatable by a motor 204 about optical axis O. The motor 204 is connected to the rotatable contaminant barrier 202 by a drive shaft 206. The motor 204 is located partly within an opening 63 in the contaminant barrier 49 and partly within the radiation collector 50. The radiation collector 50 is shown to be supported by the collector chamber 48 by means of a supporting structure 205, e.g. comprising a plurality of rods.

Downstream the motor 204 is connected to a hollow shaft 208 that is extending along optical axis O in order to avoid blocking portions of the radiation generated by source SO as much as possible. The hollow shaft 208 accommodates a plurality of cables 210 used for supplying energy to motor 204, to input and output sensing signals to sensors (not shown), etc. The hollow shaft 208 may also accommodate one or more ducts used for supplying or draining any desired gas to or from the interior of the source collector module. The cables 210 are led to the exterior of the source collector module through a sealing ring 213.

When one wishes to clean the radiation collector 50 ex-situ, i.e., at a location exterior to the collector chamber 48, one has to remove the radiation collector 50 from the collector chamber 48. One may do so but one may be hindered to do so quickly mainly because of the following reasons:

a. hollow shaft 208 need be removed as well as cables 210;

b. one must take care not to damage motor 204 or other parts, like bearings;

c. one must take care that upstream radiation collector side 50*a* does not damage downstream contaminant barrier side 49*b*.

Figure 4:
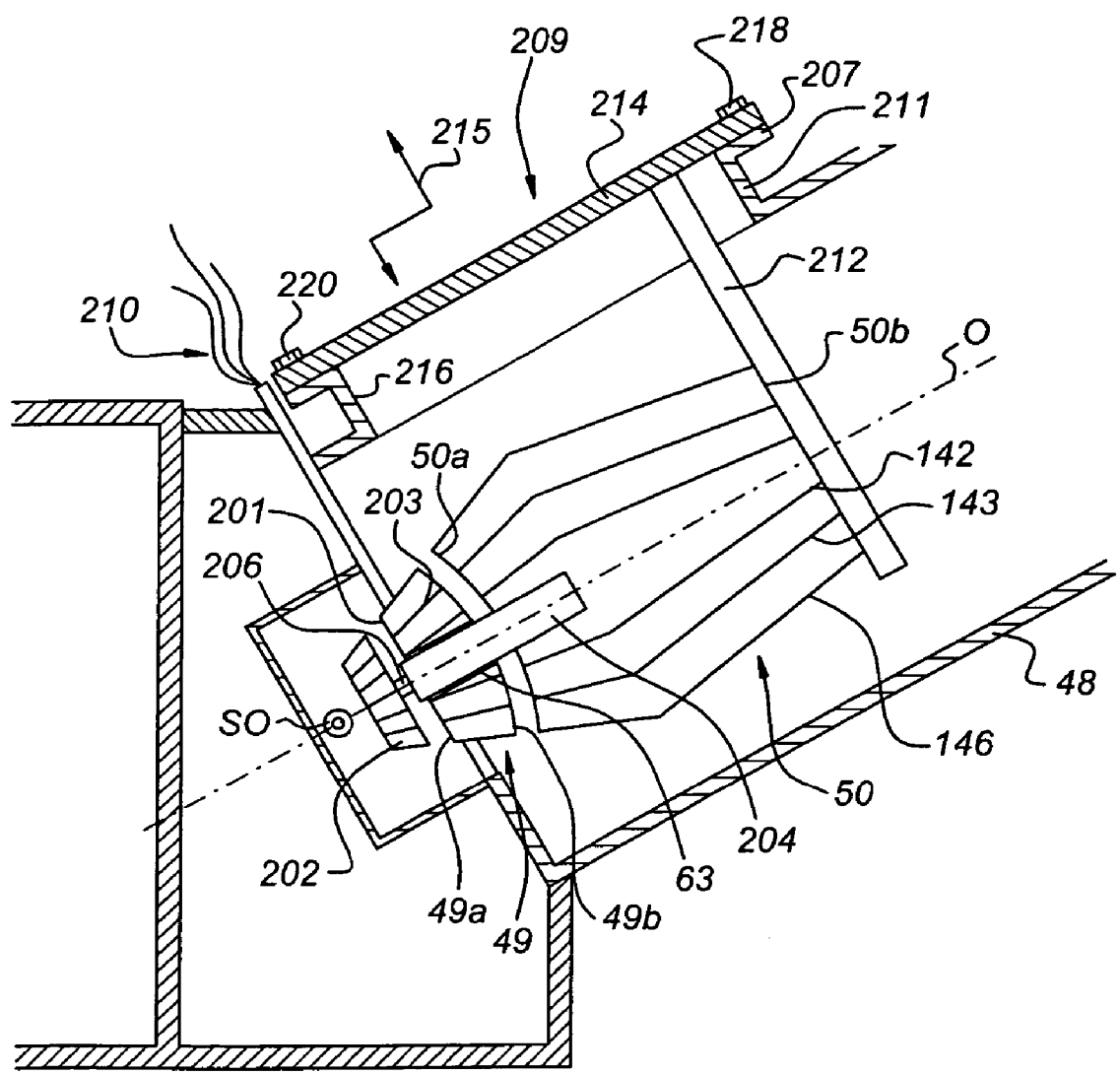
FIG. 4 schematically depicts a cross section through an alternative source collector module.

FIG. 4 shows an embodiment of a source collector module which is designed to improve ease of removal of the radiation collector 50 from the collector chamber 48. As a first feature, motor 204 is no longer downstream connected to hollow shaft 208. Instead, a hollow shaft 201 is provided upstream from radiation collector 50, accommodating cables 210, and, if desired, other components like ducts for supplying/draining gas (not shown). The hollow shaft is arranged such that it remains outside radiation collector 50. Such a hollow shaft 201 may be a spoke of contaminant barrier 49. Alternatively, such cables 210 (and, if present, ducts) may be accommodated by several spokes of contaminant barrier 49.

The collector chamber 48 comprises an opening 216 that is large enough to remove radiation collector 50 from the collector chamber 48. The collector chamber 48 has a flange 211 that extends from the collector chamber 48 and defines opening 216. The flange 211 is provided with a rim 207. The radiation collector 50 is connected to a support member 212 which is also connected to a cover plate 214. Together, radiation collector 50, support member 212 and cover plate 214 form a removable collector assembly 209.

The cover plate 214 is shown as a flat plate. However, the cover plate 214 may have any suitable form, e.g. may have a partial cylindrical shape. Moreover, the cover plate 214 may be designed as a load-lock. Such a load-lock may have two doors, one arranged to shut off an internal load-lock volume from the collector chamber 48 and one to shut off the internal load-lock volume from an external volume outside the load-lock and the collector chamber. In that external volume the collector assembly 209 can be cleaned. When removing the collector assembly 209 via such a load-lock the door between the load-lock and the collector chamber 48 will be opened, and the collector assembly 209 will be moved to the load-lock. The load-lock can be provided with the same (vacuum) pressure as the collector chamber 48 before doing so. Then, the door between the load-lock and the collector chamber 48 is closed, load-lock is provided with the same pressure as the external volume and the collector assembly can be removed from the load-lock via the other door between the external volume and the load-lock. With such a load-lock the internal environment (i.e. vacuum conditions) of the collector chamber 48 is maintained as much as possible while removing the collector assembly. For moving the collector assembly 209 back to the collector chamber 48, such a load-lock will be used in the reversed way. A load-lock can do this all automatically, as is evident to persons skilled in the art.

In a further embodiment, such a load-lock can be one and the same as the cleaning device. Thus, then, no door to an external volume is needed anymore to perform the functions of removing and cleaning because removing and cleaning will be performed by one single device.

Figure 6:
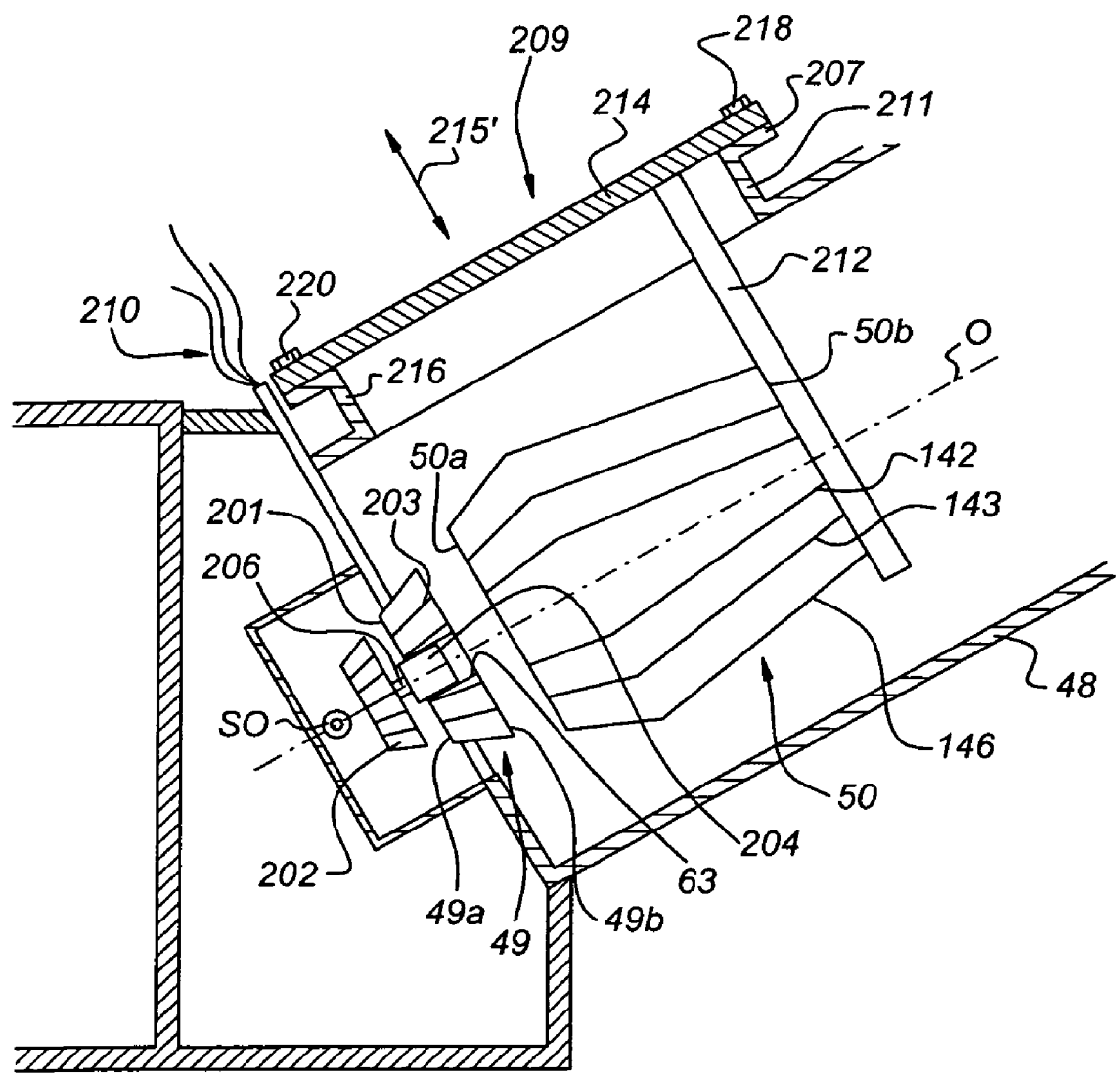
FIG. 6 schematically depicts a cross section through a further alternative source collector module.

The cover plate may seal opening 216 by a vacuum force due the vacuum inside the collector chamber 48 and non-vacuum outside collector chamber 48. However, as shown in FIG. 6, cover plate 214 can be connected to the rim 207 by removable connecting members 218, 220, e.g. bolts. However, other types of removable connecting members known to persons skilled in the art may be used, e.g., all kinds of clamping devices. The connecting members 218, 220 and the flange 211 together with its rim 207 are designed such that they form a vacuum seal to opening 216 when the cover plate 214 is connected to collector chamber 48.

In the embodiment of FIG. 4, the motor 204 still extends partly into radiation collector 50. The collector assembly 209 forms a single unit that can, in principle, easily be removed from the collector chamber 48 through opening 216. However, in order to prevent damage to motor 204 and/or contaminant barrier 49, one cannot remove the collector assembly 209 by a single movement in a direction perpendicular to optical axis O only. One way of avoiding such damage would be to first move collector assembly 209 a first, short distance perpendicular to optical axis O (to lift cover plate 214 from the collector chamber 48), then move collector assembly 209 downstream a second distance along optical axis O away from source SO and then move collector assembly 209 a third distance in a direction perpendicular to optical axis O, as indicated by arrow 215.

Figure 5A:
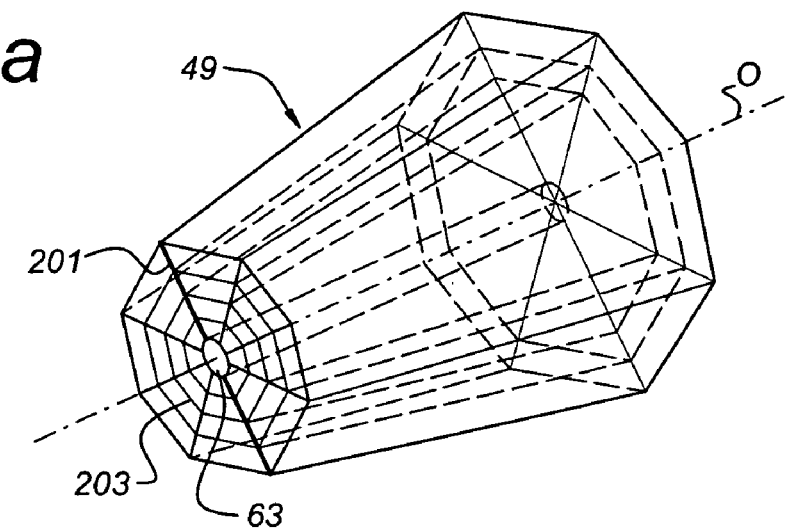
FIGS. 5a, 5b, and 5c show different possible contaminant barriers.
Figure 5B:
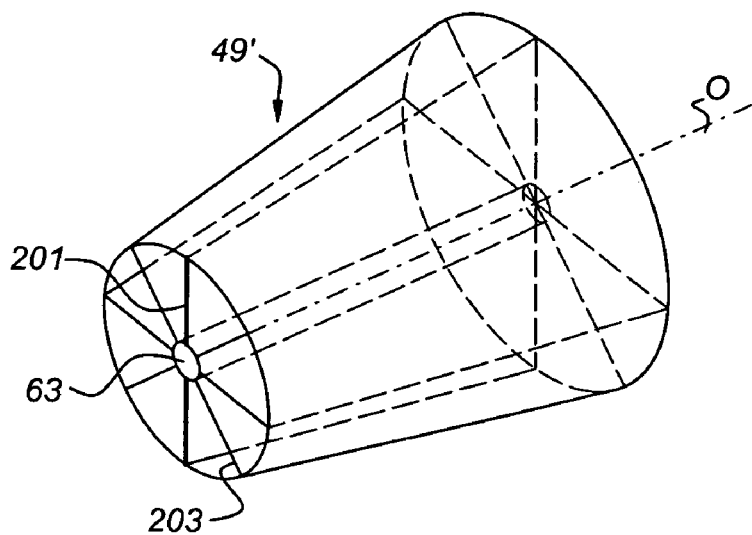
Figure 5C:
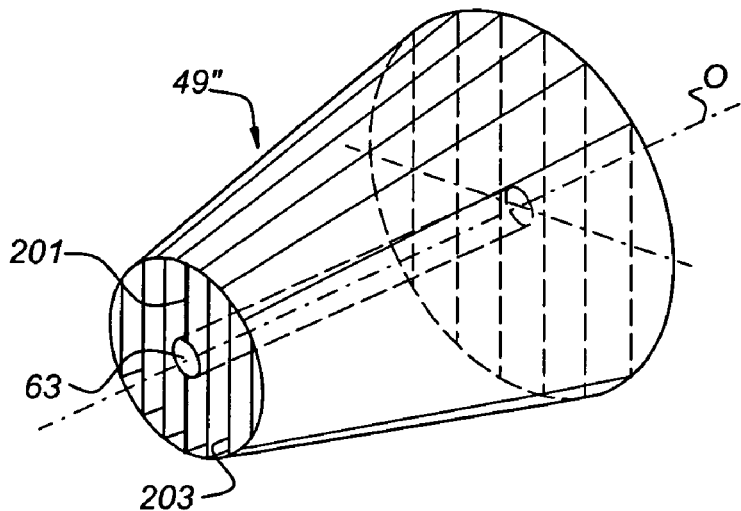

FIGS. 5a-5c shows three possible contaminant barriers 49, 49', 49". The FIGS. 5a-5c show differently shaped and oriented blades 203 all being oriented such that their surfaces are parallel to lines of sight originating from source SO. So, blades 203 do not block radiation generated by source SO directly. FIGS. 5a-5c expressly show hollow shaft 201 that is arranged for accommodating cables, ducts and the like. As mentioned earlier, the hollow shaft 201 may also have the function of a spoke for contaminant barrier 49, 49', 49". Moreover, hollow shaft 201 may be used as a support for motor 204. Of course, other supporting devices, like other hollow spokes of contaminant barrier 49, 49', 49", may be used for supporting motor 204.

FIG. 6 shows a further improved embodiment of the source collector module. The arrangement is the same as the one of FIG. 4 apart from the following constructive details:

a. the motor 204 has a shorter length such that it does not extend into radiation collector 50 anymore. This allows for the radiation collector 50 to be removed simply by removing the connecting members 218, 220 and then moving the collector assembly 209 outward in a direction perpendicular to optical axis O, as indicated by arrow 215'.

b. both downstream contaminant barrier side 49b and upstream radiation collector side 50a have flat surfaces in order to avoid damaging contact between those surfaces during moving collector assembly 209 outward as much as possible.

Figure 7A:
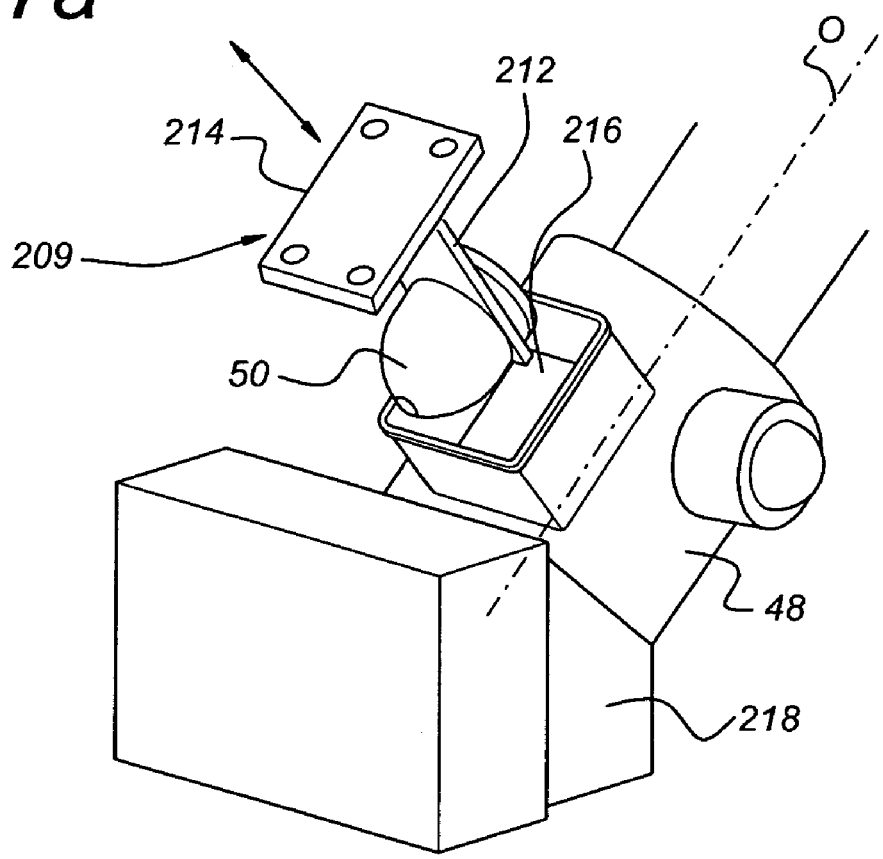
FIGS. 7a, 7b show different 3D views on a collector chamber and a collector assembly.
Figure 7B:
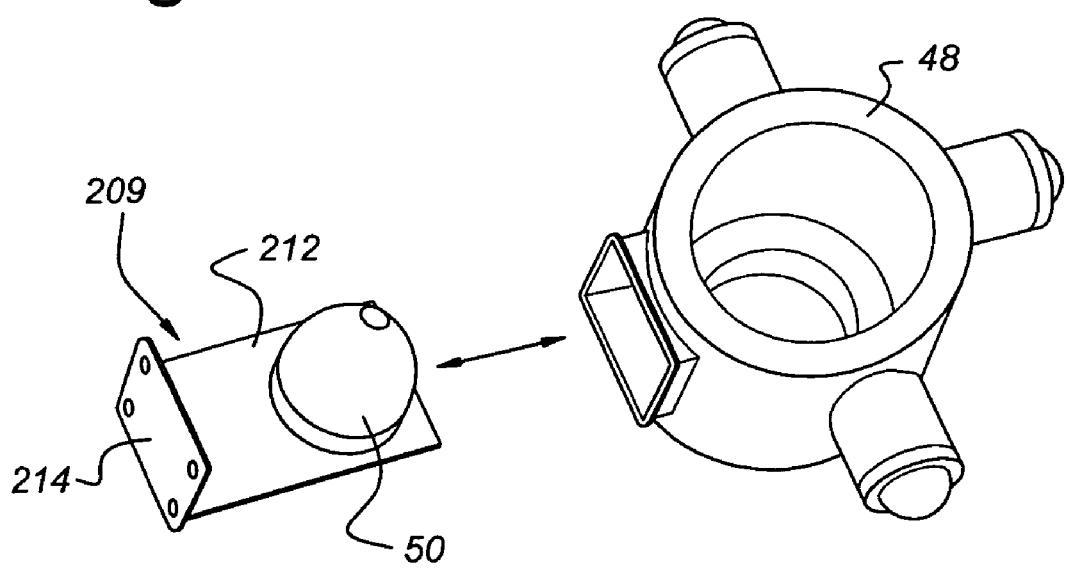

FIGS. 7a and 7b show different 3D views of possible embodiments of the collector assembly 209 and the collector chamber 48. In FIGS. 7a and 7b, the same reference numbers as used in earlier Figures refer to the same components. In FIG. 7a, the collector chamber 48 is connected to a housing 218 accommodating both the source SO and (partly) contaminant barriers 49, 202.

General Cleaning Method and General Apparatus

In an embodiment, there is provided an ex-situ cleaning method comprising providing a circumferential hull 500 designed to circumferentially enclose the collector assembly 209, thereby providing an enclosure volume; providing at least one of a cleaning gas and a cleaning liquid to the collector enclosure volume; and removing at least part of the deposition from the collector assembly 209 by the at least one of the cleaning gas and the cleaning liquid.

Figure 8A:
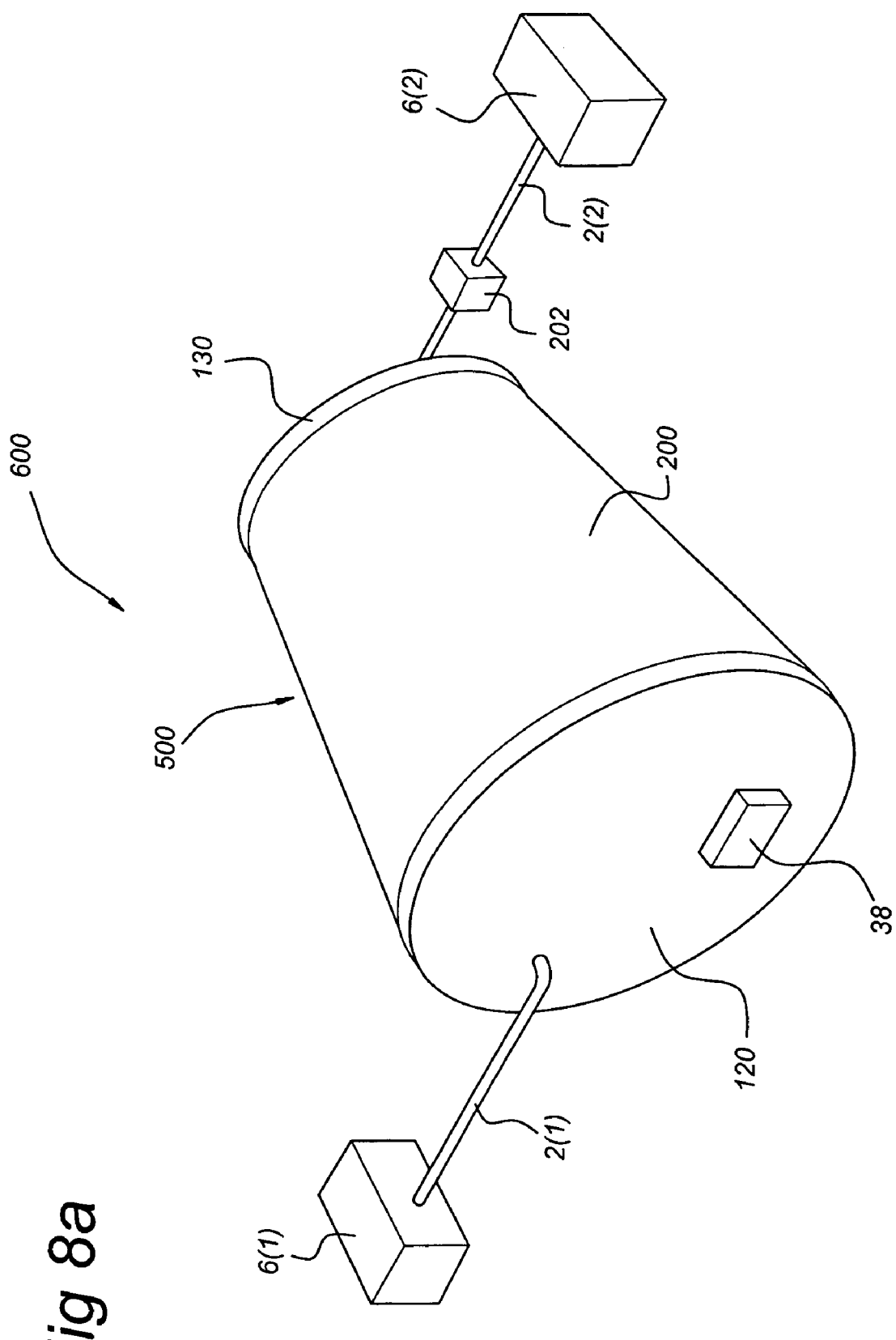

Referring to FIG. 8a, an embodiment of a cleaning device 600 is schematically depicted, with a circumferential hull 500 comprising doors 120 and 130 arranged to be used as barriers at both ends 50a and 50b, respectively, of radiation collector 50 when it is arranged inside circumferential hull 500), and surrounding hull 200 (which substantially encloses collector assembly 209). Circumferential hull 500 is designed to circumferentially enclose the collector assembly 209. This means that circumferential hull 500 may have every shape suitable to contain collector assembly 209. Circumferential hull 500 may be cubic, rectangular, cocoon like, etc. As shown, the cleaning device 600 has an inlet 2(1) configured to provide at least one of a cleaning gas and a cleaning liquid to the enclosure volume from a gas supply or liquid supply 6(1); and an outlet 2(2) configured to remove at least one of a gas and a liquid from the enclosure volume by a drain unit 6(2). Reference number 202 refers to an optional cooling device.

Figure 8B:
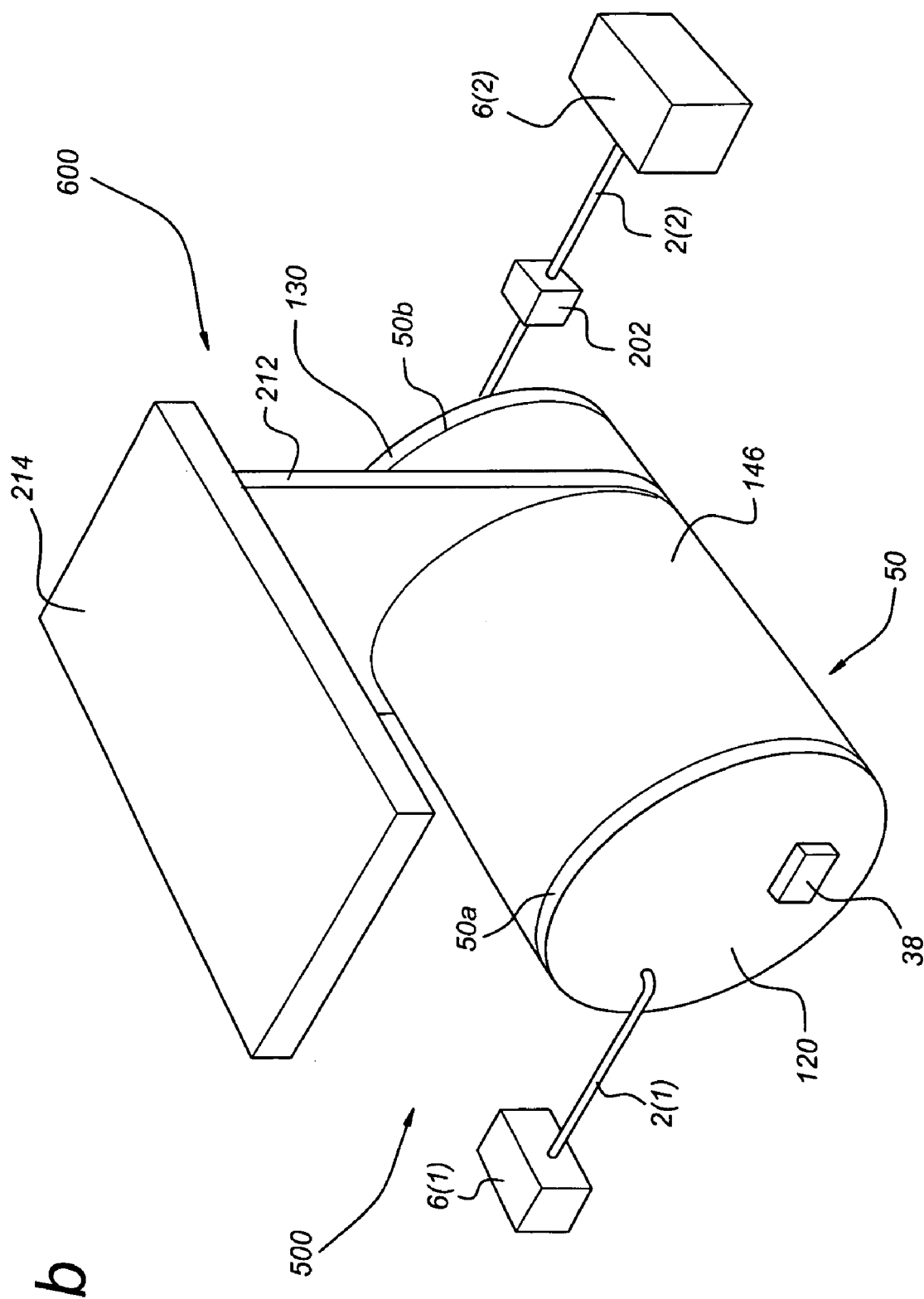

In a specific embodiment, the cleaning device 600 comprises two barriers 120, 130 designed to be arranged at both ends of the radiation collector 50, and does not have a circumferential hull of its own. Referring to FIG. 8b, hull 200 may be the outer surface of collector mirror 50, e.g. a surrounding outer surface of outer reflector 146. By providing two barriers 120 and 130, like doors or shutters, at both ends 50a and 50b, respectively, in a relatively simple way a circumferential hull is created, comprising the outer surface of outer reflector 146 and e.g. doors or shutters, etc. indicated in FIG. 8b with reference symbols 120 and 130, thereby providing an enclosure volume, i.e. herein the volume enclosed by barriers 120, 130 and the outer surface of radiation collector 50. In this embodiment, by only providing barriers 120 and 130 to both ends 50a and 50b of radiation collector 50, an enclosure volume is provided within outer reflector 146 and doors, shutter or other barriers 120 and 130. Hence, in an embodiment the action of providing circumferential hull designed to circumferentially enclose radiation collector 50 comprises providing barriers 120 and 130 to both ends 50a and 50b of radiation collector 50. Thus, cleaning device 600 of the embodiment schematically depicted in FIG. 8b may be a mere arrangement of two barriers 120 and 130, respectively, designed to provide a enclosure volume to radiation collector 50, and inlet(s) 2(1) and outlet(s) 2(2) to this volume for providing a cleaning liquid, a cleaning gas, or both, and for removing liquid(s) or gas(ses) or both.

In yet another embodiment of the apparatus of the invention, as shown in FIG. 8c, there is provided a cleaning device designed to receive collector assembly 209 in its entirety The cleaning device 600 comprises circumferential hull 500, the circumferential hull 500 comprising hull 200 and doors 120 and 130. The doors 120 and 130 and hull 200 are designed to receive collector assembly 209, and provide circumferential hull 500, which can be used as container for cleaning with one or more of a gas or liquid, e.g. via gas inlet 2(1). Referring to FIG. 8c, in a specific embodiment this may e.g. a kind of top-loader cleaning device, with, in this embodiment, two doors 120 and 130, which can slide or otherwise be opened such that an opening is created for loading collector assembly 209 into cleaning device 600. After loading cleaning device 600, doors 120 and 130 can be closed. Cleaning device 600 may have any shape suitable to enclose collector assembly 209. In a variation, the embodiment as depicted in FIG. 8c provides a circumferential hull 500 which substantially encloses collector mirror 50. To this end, doors 120 and 130 may have notches such that doors 120 and 130 can be arranged to circumferentially close around support member 212.

In an embodiment, the cleaning device of the invention further comprises a heating element configured to heat the enclosure volume. As described above, the term "a heating element" may include a number of heating elements. Heating of the enclosure volume may be performed in different ways, e.g. in an embodiment by heating one or more of at least part of the enclosure volume, in an embodiment by heating the cleaning gas and in an embodiment by heating the cleaning liquid. Heating the enclosure volume may be performed by heating the optical element, like radiation collector 50, within the enclosure volume or by providing heating elements within the enclosure volume of circumferential hull 500. Thus, the cleaning device could perform a vacuum baking function to provide the collector assembly with predetermined water specifications that are associated with water specifications of the collector chamber 48.

Figure 9:
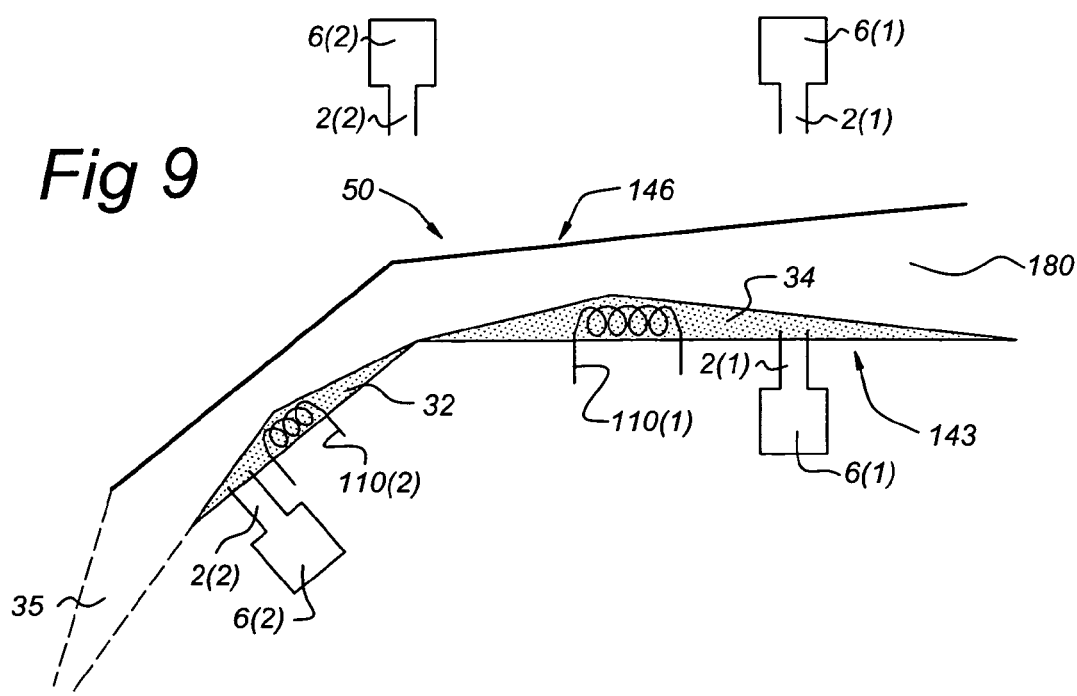
FIG. 9 shows a radiation collector with some filaments.

In a specific embodiment, shown in FIG. 9, the radiation collector 50 further includes one or more heating elements for heating the enclosure volume. FIG. 9 schematically depicts a part of radiation collector 50 with intermediate reflector 143 and outer reflector 146. Within a space 180 between reflectors 143 and 146, there are some parts of space 180 which are arranged outside the EUV radiation 35, i.e., in the shadow of mirror 143. These parts of space are indicated by gray areas with reference numbers 32 and 34. For example, these spaces can be used to arrange filaments 110(1) and 110(2). However, these areas can also be used to arrange heating wires or tubes for transporting hot or cold fluids in order to control the temperature (not shown).

Figure 10:
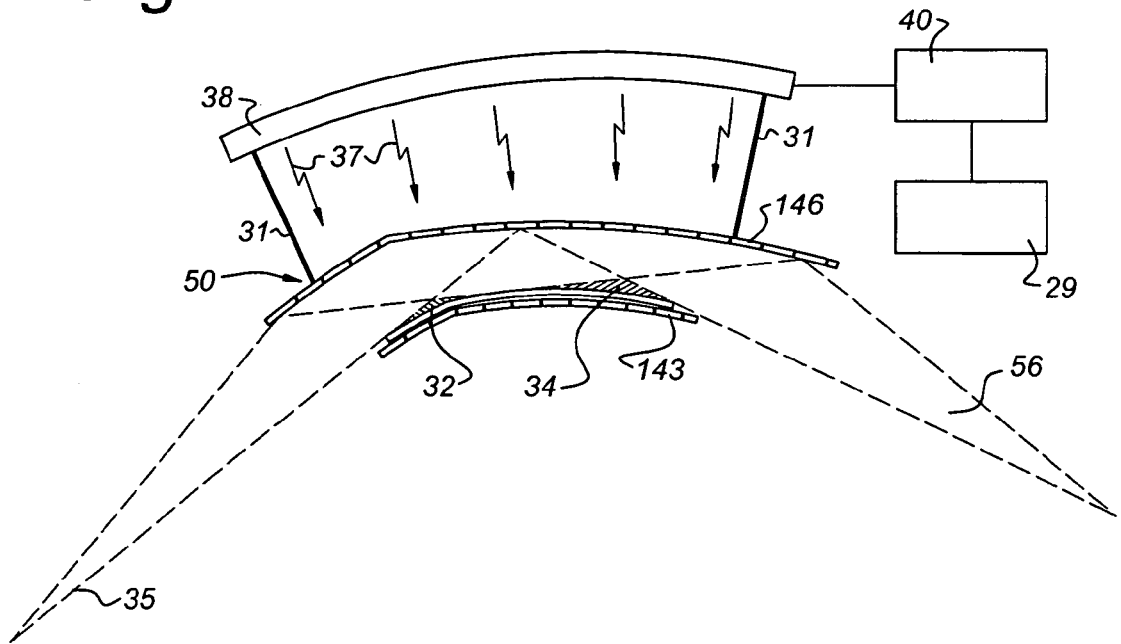
FIG. 10 shows a radiation collector with a temperature controller.

FIG. 10 schematically shows a heat source 38 controlled by a controller 40. The heat source 38 may be connected to outer reflector 146 by connectors 31. The connectors 31 may be heated conductively. The controller 40 may be implemented as a suitably programmed computer, or a controller with suitable analogue and/or digital circuits. The heat source 38 generates heat, indicated with arrows 37, which is directed to outer reflector 146 of radiation collector 50. Heat source 38 may include different heating elements and/or may be arranged such that different areas of outer reflector 146 can selectively be heated. In this way, removal of deposition may better be controlled. Heat source 38 may be controlled by controller 40, which may amongst others also control a pump 29, or measuring devices such as thermocouples, gas pressure, gas flow, an analysis unit that analyses reflectivity of mirror 142 and/or mirror 146, an analysis unit that measures deposition layer thickness, etc (not shown in FIG. 10, but known to the person skilled in the art). Heaters, for example heat source 38, but also heating elements connected to radiation collector 50, may be selected from the group of heating wires (like filaments 110(1) and 110(2) in FIG. 9), tubes containing/transporting hot fluids or hot gasses, providing hot/heated gasses to the volume to be heated, heaters connected to or in thermal contact with radiation collector 50 (such as heat source 38 in FIG. 10) or heaters connected to or in thermal contact with gas barriers (such as heat source 38 in FIG. 10), heating lamps (like IR lamps) and an EUV source (like source SO). The latter two may e.g. be used as preheating source.

However, in an embodiment heat source 38 may also include heating elements on the internal surface of circumferential hull 500, either on one or more of barriers 120 and 130 and hull 200). Further, gas or liquid provided via inlet 2(1) or door 120 or 130 may also be (pre)heated by e.g. a (pre)heating device arranged between gas or liquid supply (or pump) 6(1) and circumferential hull 500, such that the enclosure volume is heated. Hence, in an embodiment, there is provided a method further including heating at least part of one or more selected from the group of the radiation collector enclosure (such as doors 120, 130, and hull 200) and cleaning gas or the cleaning liquid or both for providing to the enclosure volume. In an embodiment, one or more heating filaments within the enclosure volume which can be used for heating the enclosure volume may also be used for providing hydrogen radicals from $H_2$ in the $H_2$ containing gas (see also below).

In an embodiment, circumferential hull 500 may be construed such that a kind of test tube is provided. In this embodiment, one may need only one opening and one door 120 (or 130) for entrance of the collector assembly, and circumferential hull 500 may be slid over the radiation collector or the radiation collector may be slid into circumferential hull 500, followed by closing door 120 (or 130) and the cleaning method of the invention.

In these and other embodiments, the term "barrier" refers to doors, valves, shutters, diaphragm shutters, or other elements or devices to close a room, space, tube, etc., and in the context of the present invention also to close sides 50a or 50b of the radiation collector 50.

Herein, internal volume is the volume enclosed by the outer reflector 146 and both sides 50a and 50b of radiation collector 50. Further, "enclosure volume" refers to this internal volume enclosed by circumferential hull 500, wherein this volume is enclosed by outer reflector(s) 146 of radiation collector 50 and barriers 120 and 130, respectively (e.g. in case of the embodiment schematically depicted in FIG. 8b), or to the volume provided by a circumferential hull 500, wherein this volume is enclosed by hull 200 and barriers 120 and 130, respectively (e.g. in case of the embodiment schematically depicted in FIGS. 8a and 8c). However, circumferential hull 500, for e.g. a cleaning device as depicted in FIG. 8a, may also have one closed end, e.g. a hull 200 integrated with "door" 130 (like a test tube), such that the enclosure volume in this embodiment is defined by the volume enclosed by hull 200 and barrier 120 for the only opening for entrance of the collector assembly 209.

Referring to FIGS. 8a, 8b and 8c, the gaseous or liquid cleaning means can be provided via supply or pump 6(1) and inlet 2(1).

Gas, either as cleaning gas or as reaction product gas(ses) (e.g. tin hydride or tin halogenide as exhaust gasses) or both (gas mixture), and liquid, either as cleaning liquid or reaction product liquid(s) or both (e.g. cleaning liquid containing reaction products) can be removed from circumferential hull 500, by outlet 2(2), for example by pump 6(2). For example, the cleaning process can be a batch or continuous process. For example, in case a batch process is used, outlet(s) 2(2) may not be necessary. Further, e.g. in the case of a batch process, the sides 50a and 50b of radiation collector 50, respectively, which are closed by barriers 120 and 130, respectively, may also be used as gas or liquid inlet 2(1).

Pump or gas supply 6(1), pump 6(2), inlet 2(1) and outlet 2(2) may also include a number of supplies/pumps, inlets and outlets, respectively. These may be arranged and connected to hull 200, or doors 120 or 130, etc.

In an embodiment, the cleaning gas is selected from one or more of a group consisting of a halogen containing gas and a hydrogen containing gas.

H Radical Cleaning

In an embodiment, there is provided a cleaning method wherein the gas includes a $H_2$ containing gas, and wherein the method further includes producing hydrogen radicals from $H_2$ from the $H_2$ containing gas. In this way, the deposition is removed in the removal process by bringing the deposition into contact with hydrogen radicals. The hydrogen radicals may be produced in different ways. In an embodiment, at least part of the hydrogen radicals are produced from $H_2$ from the $H_2$ containing gas by one or more radical formation devices selected from the group of a hot filament, a plasma, radiation, and a catalyst configured to convert $H_2$ into hydrogen radicals, which dissociate $H_2$ to H radicals or H-atoms adsorbed to the surface of the catalyst. The catalyst may include transition metal based catalysts, for example catalysts including Pd, Pt, Rh, Ir and Ru. The catalyst may also include a Ru layer, for example the surface of a grazing incidence mirror or of a multilayer of the radiation collector 50, wherein Ru is included in a top layer. The radiation for producing radicals may include radiation such as EUV radiation, DUV radiation, UV radiation, for example radiation including radiation having a wavelength selected from the group of 193 nm, 157 nm and 126 nm, and the radiation may include radiation such as electron beam or ionizing radiation, such that hydrogen radicals may be formed from hydrogen. In an embodiment, the source SO of a lithographic apparatus is used as a source SO of radiation to produce radicals. In another embodiment, an additional radiation source is present, to provide such radiation that induces formation of hydrogen radicals from hydrogen gas.

The hydrogen radicals react with contaminants like Sn (or Sn oxides), C, Si (or Si oxides), etc., leading to volatile hydrides and/or water (e.g. when an oxide like Sn oxide is reduced) that may be removed by, for example, an exhaust. Sn and Si, that may have oxidized or which may be at least partially present as oxide as deposition or cap layer may also be reduced to elemental Sn and Si, respectively, and may subsequently be removed as hydride (or as halogenide, see below). Hence, in this embodiment, cleaning is substantially only performed with atomic hydrogen to reduce and volatilize tin oxides (and/or other oxide deposition, for example silicon oxides, on radiation collector 50) to volatile tin hydrides (and/or other hydrides, for example silicon hydride, germanium hydride, $CH_4$, etc.).

In order to remove deposition on the reflectors 143 and 146 gas including $H_2$ may be provided by gas supply 6(1) through inlet 2(1) in the space 180 where mirrors 143 and 146 of radiation collector 50 are present. Due to the presence of hot filament 110(1), hydrogen gas dissociates in hydrogen radicals. Part of the hydrogen radicals will come into contact with the deposition on the surface of radiation collector 50, where the hydrogen radicals may react with one or more of Si (including Si oxides), Sn (including tin oxides) and C, etc. In this way, radiation collector 50 with deposition is brought into contact with at least part of the hydrogen radicals and at least part of the deposition is removed. Volatile compounds may be at least partially be removed by an exhaust or pump for example as indicated with reference number 6(2) and 2(2), respectively. Alternatively, several supplies and several exhausts may be provided. Deposition removal rates of, for example, 100-150 nm/hour can be obtained. Growth and removal rates may be derived from ex situ X-ray fluorescence spectroscopy.

For example, after or during providing the gas to the internal volume of the radiation collector 50 filaments 110(1), 110(2) may be heated such that hydrogen radicals are formed, in the case of a hydrogen gas. A typical temperature for filament 110(1), 110(2) is between about 1400 and 2400° C. A typical temperature in the internal volume of the radiation collector 50 during treatment is between room temperature (about 20° C.) and 500° C., with a desired temperature range of about 50-300° C., for example between about 100 and 200° C. Heating filament(s) 110(1), 110(2) as well as e.g. a heating element 38 integrated in a shutter 120 or 130 (see e.g. FIGS. 9 and 10) as well as other heating elements can be used to provide this temperature.

Halogen Cleaning

Deposition, for example comprising one or more elements selected from the group of B, C, Si, Ge and Sn, may be removed by hydrogen radicals, but, for example, Sn may also be removed by providing halogens. Hence, in an embodiment the cleaning method further comprises providing a halogen containing gas. In a further embodiment, there is provided a method wherein the gas includes a $I_2$ containing gas, since this gas shows good results by selectively removing deposition from the surface of a mirror, in particular for Sn deposition, with small or substantially no corrosion effects to other parts of the lithographic apparatus. Hence, in this embodiment, cleaning is substantially only performed with a halogen containing gas to volatilize tin (and/or other deposition, for example silicon on radiation collector 50) and thereby remove deposition on the radiation collector 50.

A halogen containing gas may be provided to the internal volume of the radiation collector 50 via inlet(s) 2(1) from a source 6(1). By providing a temperature between about 100° C. and 500° C., for example between about 100° C. and 300° C., for example between about 130-200° C., the halogens form, for example, tin halogenides, thereby removing at least part of the tin from the surface of radiation collector 50, in the case of deposition including Sn. Heating filament(s) 110(1), 110(2) as well as a heating element 38 integrated in a door or shutter 130, as well as other heating elements can be used to provide this temperature.

In an embodiment, heating filaments 110(1), 110(2) may also be used to provide halogen radicals from halogen or halogen compounds contained in the halogen containing gas.

H Radical and Subsequent Halogen Cleaning

According to yet a further embodiment of the invention, the cleaning method comprises providing a $H_2$ containing gas; producing hydrogen radicals from $H_2$ of the $H_2$ containing gas; and subsequently providing a halogen containing gas. In this way, the following processes may be performed: cleaning with atomic hydrogen to reduce $SnO_x$ (and/or other oxide deposition, for example silicon oxides, on radiation collector 50) to Sn (and/or other elemental or metallic compounds, respectively, for example Si); cleaning with a halogen, for example $I_2$, to remove Sn (and/or other elemental compounds, for example Si) in the form of halogenides, for example iodides (and/or other halogenides, for example $SiI_4$).

In a variation, the hydrogen containing gas also includes halogen gas, such that these two processes as described above are performed substantially simultaneously. This may be performed by a method including removing at least part of the deposition from the radiation collector 50 in a removal process including providing a $H_2$ and a halogen containing gas in at least part of the enclosure volume containing the radiation collector 50; producing hydrogen radicals from $H_2$ from the $H_2$ containing gas; and bringing the radiation collector 50 with the deposition into contact with at least part of the hydrogen radicals and the halogens in the gas and removing at least part of the deposition. The halogens may form volatile halides, and may improve the removal of e.g. Sn and Si deposition.

H Radical/Halogen or Halogen and Subsequent H Radical Cleaning

In an above described embodiment, the cleaning method comprises providing a halogen containing gas. In another above described embodiment, the cleaning method comprises providing a $H_2$ containing gas; producing hydrogen radicals from $H_2$ of the $H_2$ containing gas; and subsequently providing a halogen containing gas. In yet a further embodiment, subsequently to providing the halogen containing gas in either of these two embodiments, a $H_2$ containing gas is (again) introduced: a $H_2$ containing gas is (again) introduced and hydrogen radicals are produced. In this way, rests of metal halides like tin halides and rests of halogens of the halogen containing gas (like $I_2$) may be removed by forming hydrides.

A gas including a combination of $H_2$ and a halogen may e.g. be provided by gas supply 6(1) through inlet 2(1) in the space where reflectors 143 and 146 of radiation collector 50 are present.

Getter

In an embodiment one or more getter plates, getter masses or getter coatings may be provided, on which one or more gasses selected from halogen gas, halogenides and hydrides may form deposits or with which they may react, which are then not detrimental to the other optical elements of the lithographic apparatus anymore. For example, a Ni coating may be used to bind $I_2$. Such getter material may be used as separate or as additional barrier, for example arranged on at least part of the surface of the shutters 120 and/or 130 directed to the internal volume of radiation collector 50, or on at least part of hull 200 (see e.g. FIGS. 8a and 8c).

In a further embodiment, the method further includes providing a getter material to the enclosure volume. Getter materials may be selected from one or more metals selected from the group of Sn, Sb, Al, Zr, Cd, Fe, Pb, Cu, Ag and Ni, which metals may react, for example, with $I_2$. For example, Sn, Sb, Al, Zr, Cd and Fe react at about 150° C. with $I_2$ to form volatile products at these temperatures or higher, and Pb, Cu, Ag, Ni react at 300-500° C. with $I_2$ to form volatile products at these temperatures or higher. Getter material is provided and a cooling device, a heating device or both heating and cooling devices are provided. In this way, the getter material can be maintained at the desired temperature, i.e. below the temperature that volatile halogenides etc. are formed ("gettering"), but the getter material may also be heated such that the getter can be regenerated by removal of, for example, the top layer by formation of volatile halogenides, thereby also forming a fresh metal layer, that may subsequently be used as getter material. The regeneration process may also be employed offline.

In an embodiment, the enclosure volume further comprises a cooling element configured to cool at least part of the enclosure volume. As described above, the term "a cooling element" may be directed to a number of cooling elements. In a specific embodiment, shutter(s) 120 and/or 130, hull 200, maybe cooled.

In an embodiment, gettering is performed by providing and using shutters 120 and/or 130 as a cold trap, to reduce the partial pressure of halogenides. For example, most metal iodides have a low vapor pressure at room temperature and will be trapped. Hence, in an embodiment there is provided a method further including cooling of e.g. an exhaust gas from the enclosure volume. Alternatively, or additionally, at least one selected of at least part of shutter 120, at least part of shutter 130 and at least part of enclosing hull 200 may be cooled by a cooling device(s), suitable for cooling that part to a temperature below room temperature, for example suitable for cooling below 0° C., for example suitable for cooling in a range of −196° C. (liq. $N_2$ temperature) and 0° C., for example about −100° C. In yet a further embodiment, such a cooling device such as a cold trap is provided to an exhaust 2(2), as schematically depicted in FIGS. 8a and 8b with cooling device 202. Hence, the radiation collector enclosure may further include a cooling device for at least part of the radiation collector enclosure. Further, in an embodiment the cleaning device 600 of the present invention may further include a cooling device configured to cool an exhaust for exhaust gas from the enclosure volume. Hence, according to an embodiment, there is provided a method further comprising cooling at least one of at least part of the enclosure volume and an exhaust gas from the enclosure volume.

Hence, heater 38 may also include a cooler, i.e.: reference symbol 38 refers to a device for controlling the temperature and being able to heat or to cool one or more of circumferential hull 500 (e.g. barrier 120, barrier 130 (if present), hull 200 (if present)), a cleaning gas, a cleaning liquid, an exhaust gas (see also cooling device 202), an exhaust liquid, and a heating filament 110(1), 110(2). Heating and cooling may be controlled by controller 40.

Liquid

In an embodiment of the invention, the cleaning means comprises a cleaning liquid. In a variant, the cleaning liquid comprises an etching liquid. This liquid may comprise acids, like e.g. $H_2SO_4$, $H_3PO_4$, HF, HCL, HBr, HI, $H_3BO_3$, or other acids know to the person skilled in the art like e.g. oxalic acid, acetic acid, formic acid, etc, and combinations of two or more of these acids. The liquid may be provided via inlet(s) 2(1), and the radiation collector 50 may be dipped into the liquid or the liquid may be sprayed on the radiation collector 50 within circumferential hull 500. The liquid may be heated before entering the enclosure volume, but may also be heated within circumferential hull 500, e.g. by heating devices 110(1), 110(2) or 38. The person skilled in the art will choose the concentration of one or more acids in an etching liquid such that etching to a desired extent is provided. The temperature of the etching liquid may for example b between about −20 and +150° C., and will also be chosen by the person skilled in the art such that etching to a desired extent is provided.

The collector enclosure may further include a cooling device for at least part of the collector enclosure. As described above, device 38 may also be used in an embodiment for cooling at least part of circumferential hull 500, like barriers 120 and/or 130, hull 200, etc. Further, cleaning device 600 of the present invention may further include a cooling device 38 configured to cool an exhaust for exhaust liquid from the enclosure volume. Hence, according to an embodiment, there is provided a method further comprising cooling at least one of at least part of the enclosure volume and an exhaust liquid from the enclosure volume.

Cleaning may comprise a number of cleaning steps, either a number of liquid cleaning steps or a number of gaseous cleaning steps as described above, or combinations thereof, either simultaneously or subsequently. Cleaning may be monitored by measuring the performance of the optical element, e.g. measuring reflectivity of radiation collector 50 (see also above).

Protection, Coating

Due to the aggressive media that may be used for cleaning, especially the liquid cleaning technique, surfaces that need not to be cleaned but which may be attacked by the cleaning means may be provided with a protection. In an embodiment, the method further comprises protecting at least one of at least part of the radiation collector and at least part of the circumferential hull 500 with a protective material. E.g. in an embodiment at least part of the circumferential hull may comprise a protective material, or at least part of the non reflection part of reflectors 142, 143 and 146 may comprise a protective material. In an embodiment, the protective material is e.g. a coating, like e.g. a metallic or ceramic coating, etc. In an embodiment, such protective material or coating is substantially free of pinholes. In yet another embodiment, the layer thickness of such protective material or coating is $\geq 5$ μm, e.g. about 5-20 μm, in a variant about 5-15 μm.

In a variant, a coating is chosen to protect those parts of the optical element, like radiation collector 50, that are not optically active (i.e. e.g. the reflecting surfaces of reflectors 142, 143, 146 are optically active, whereas the back sides of these reflectors are not optically active). In yet a further embodiment, at least part of the circumferential hull 500 comprises a coating, i.e. especially those parts of circumferential hull 500 that are exposed to a cleaning liquid.

Protection, Material

In another embodiment, the method further comprises protecting at least one of at least part of the radiation collector and at least part of the circumferential hull 500 by applying a material having a standard reduction potential larger than the standard reduction potential of Sn, i.e. in a variant at least part of the radiation collector or in another variant at least part of the circumferential hull 500 at least partially comprise a material or a coating having a standard reduction potential larger than the standard reduction potential of Sn. For example, in case a Ru mirror surface of reflectors 142, 143 and 146 is to be cleaned from Sn; the rest of the outer surface of the reflectors that may be contacted with a cleaning liquid may be protected against such cleaning liquid by a material like Au, Ir, Ag, Ru, and Rh, either e.g. as coating material or as e.g. construction material, whereas metals like Fe, Ni, etc. are avoided or otherwise protected, e.g. by a coating. Further, in yet another embodiment, the coating may be a Sn coating, e.g. having a thickness of about $\geq 5$ μm, e.g. about 5-20 μm, in a variant about 5-15 μm.

Below, an overview of some materials are given, based on the reduction potentials E° (in Volt) as derived from the Handbook of Chemistry and Physics, 69$^{th}$ Edition, CRC Press, Boca Raton, Fla., USA:

| Reaction | E° (V) |
|---|---|
| $Au^+ \leftrightarrow Au$ | 1.692 |
| $Ir^{3+} \leftrightarrow Ir$ | 1.156 |
| $Pt^{2+} \leftrightarrow Pt$ | 1.118 |
| $Pd^{2+} \leftrightarrow Pd$ | 0.951 |
| $Ag^+ \leftrightarrow Ag$ | 0.7996 |
| $Rh^{2+} \leftrightarrow Rh$ | 0.600 |
| $Ru^{2+} \leftrightarrow Ru$ | 0.455 |
| $Fe^{3+} \leftrightarrow Fe$ | −0.037 |
| $Sn^{2+} \leftrightarrow Sn$ | −0.1375 |
| $Ni^{2+} \leftrightarrow Ni$ | −0.257 |
| $In^{3+} \leftrightarrow In$ | −0.3382 |
| $Fe^{2+} \leftrightarrow Fe$ | −0.447 |

In a variant, a material is chosen to protected those parts of the optical element, like radiation collector 50, that are not optically active are provided with a protective material having a reduction potential equal or larger than 0.2V. In yet a further embodiment, a protective material having a reduction potential equal or larger than 0.4V is selected. In yet a further embodiment, at least part of the circumferential hull 500 comprises a material having a standard reduction potential larger than the standard reduction potential of Sn, i.e. especially those parts of circumferential hull 500 that are exposed to a cleaning liquid.

Protection, Voltage

In yet another embodiment, there is provided a method further comprising protecting at least one of at least part of the radiation collector and at least part of the circumferential hull 500 by applying a potential smaller than the standard reduction potential of Sn. Hence, to this end there may in an embodiment also be provided a cleaning device further comprising a voltage source designed and arranged for applying a potential smaller than the standard reduction potential of Sn to at least one of at least part of the radiation collector and at least part of the circumferential hull. Especially those parts are protected by the potential that are not optically active, like the back sides of reflectors 142, 143 and 146, or those parts of circumferential hull 500 that are exposed to the cleaning liquid, like the internal surface of hull 200 and/or the internal surface of doors/shutters 120 and 130.

In a specific embodiment, the voltage is at least −1.0 V, in yet a further variant, at least −1.5 V or smaller, in even a further variant −2 V or smaller, like e.g., −3 V or smaller, −4

V or smaller, or at least −5 V or smaller. For applying the negative potential, a voltage supply may be used, which is connected to the surfaces which are to be protected.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it should be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein. This computer program may be used to control the removal of the deposition, control the pressures, control the partial pressures, control the gas flows of the gasses, control the doors/shutters 120/130, etc.

The descriptions above are intended to be illustrative, not limiting. Thus, it will be apparent to one skilled in the art that modifications may be made to the present invention as described without departing from the scope of the claims set out below.

The present invention is not limited to application of the lithographic apparatus or use in the lithographic apparatus as described in the embodiments. Further, the drawings usually only include the elements and features that are necessary to understand the present invention. Beyond that, the drawings of the lithographic apparatus are schematic and not on scale. The present invention is not limited to those elements, shown in the schematic drawings (e.g. the number of mirrors drawn in the schematic drawings). Further, the present invention is not confined to the lithographic apparatus described in relation to FIGS. 1 and 2. The present invention described with respect to a radiation collector may also be employed to (other) multilayer, grazing incidence mirrors or other optical elements. It should be appreciated that embodiments described above may be combined. For example, more heating elements 38 or hot filaments 110(1), 110(2) may be present as depicted, or may be present on other places as schematically depicted in the Figures. Further, gas supply and pumps, respectively, inlets and outlets, respectively, may in some cases be interchanged. For example, an inlet for providing a gas, may subsequently be used as outlet for removing a gas.

What is claimed is:

1. A collector assembly comprising a radiation collector, a cover plate and a support member connecting said radiation collector to said cover plate, said cover plate being designed to cover an opening in a collector chamber.

2. A collector assembly according to claim 1, wherein said support member is a plate like structure.

3. A collector assembly according to claim 1, wherein said cover plate has a flat surface.

4. A collector assembly according to claim 1, wherein the collector is constructed to focus radiation emitted by a radiation source in a virtual source point.

5. A collector assembly according to claim 1, wherein the collector is a grazing incidence collector.

6. A collector assembly according to claim 1, wherein the cover plate has a partial cylindrical shape.

7. A collector assembly according to claim 1, wherein the cover plate is designed as a load-lock arranged to shut off an internal load-lock volume from an external volume outside the load-lock.

8. A collector assembly according to claim 7, wherein the load-lock has a door arranged to shut off the internal load-lock volume from the external volume.

9. A collector assembly according to claim 1, wherein the cover plate is designed as a load-lock arranged to shut off an internal load-lock volume from the collector chamber.

10. A collector assembly according to claim 9, wherein the load-lock has a door arranged to shut off the internal load-lock volume from the collector chamber.

* * * * *